United States Patent
Koo et al.

(10) Patent No.: US 7,687,807 B2
(45) Date of Patent: *Mar. 30, 2010

(54) INVERTER

(75) Inventors: Jae Bon Koo, Daejeon (KR); Seong Hyun Kim, Daejeon (KR); Kyung Soo Suh, Daejeon (KR); Chan Hoe Ku, Kyounggi (KR); Sang Chul Lim, Daejeon (KR); Jung Hun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 22 days.

This patent is subject to a terminal disclaimer.

(21) Appl. No.: 11/834,044

(22) Filed: Aug. 6, 2007

(65) Prior Publication Data

US 2008/0080221 A1 Apr. 3, 2008

(30) Foreign Application Priority Data

Sep. 29, 2006 (KR) ...................... 10-2006-0096247

(51) Int. Cl.
*H01L 31/00* (2006.01)
(52) U.S. Cl. .................... 257/59; 257/348; 257/E29.29
(58) Field of Classification Search .................. 257/40, 257/59, 72, 347, 348, 350, 351, E51.006, 257/E29.117, E29.137, E29.29, E29.291, 257/E29.293, E29.294
See application file for complete search history.

(56) References Cited

U.S. PATENT DOCUMENTS 3,903,431 A 9/1975 Heeren (Continued)

FOREIGN PATENT DOCUMENTS

JP 05-152560 A 6/1993

(Continued)

OTHER PUBLICATIONS

Gelinck, G.H. et al. "Dual-gate organic thin-film transistors." Applied Physics Letters 87, 073508 (2005). © 2005 American Institute of Physics.

(Continued)

*Primary Examiner*—Minh-Loan T Tran
*Assistant Examiner*—Vongsavanh Sengdara
(74) *Attorney, Agent, or Firm*—Ladas & Parry LLP

(57) ABSTRACT

Provided are a structure and fabricating method of a new inverter for controlling a threshold voltage of each location when an inverter circuit is manufactured using an organic semiconductor on a plastic substrate.

In general, p-type organic semiconductor is stable. Accordingly, when the inverter is formed of only the p-type semiconductor, a D-inverter composed of a depletion load and an enhancement driver has large gains, wide swing width and low power consumption, which is more preferable than an E-inverter composed of an enhancement load and an enhancement driver. However, it is impossible to form a depletion transistor and an enhancement transistor on the same substrate while controlling them by locations.

To overcome such a difficulty, the structure of the inverter in which a bottom gate organic semiconductor transistor showing enhancement type characteristics is used as a driver transistor, and a top gate organic semiconductor transistor showing depletion type characteristics is used as a load transistor, and a manufacturing method thereof are proposed. According to this structure, a passivation effect of an organic semiconductor may be additionally obtained by a second insulating layer and a second gate electrode material which are on top of the organic semiconductor, and a high degree of integration may also be improved.

17 Claims, 3 Drawing Sheets

U.S. PATENT DOCUMENTS

| | | | |
|---|---|---|---|
| 3,946,245 A | | 3/1976 | McClaughry |
| 4,384,220 A | | 5/1983 | Segawa et al. |
| 4,417,162 A | | 11/1983 | Keller et al. |
| 4,714,840 A | | 12/1987 | Proebsting |
| 5,699,007 A | * | 12/1997 | Farbarik et al. ............ 327/435 |
| 5,705,413 A | | 1/1998 | Harkin et al. |
| 5,744,823 A | | 4/1998 | Harkin et al. |
| 5,998,103 A | * | 12/1999 | Zhang ..................... 430/327 |
| 6,462,723 B1 | * | 10/2002 | Yamazaki et al. ............ 345/82 |
| 6,683,333 B2 | * | 1/2004 | Kazlas et al. ............... 257/197 |
| 6,852,995 B1 | | 2/2005 | Eccleston et al. |
| 7,030,666 B2 | | 4/2006 | Brazis et al. |
| 7,122,398 B1 | | 10/2006 | Pichler |
| 2002/0139978 A1 | * | 10/2002 | Yamazaki et al. ............ 257/69 |
| 2004/0119504 A1 | | 6/2004 | Baude et al. |
| 2004/0169176 A1 | | 9/2004 | Peterson et al. |
| 2005/0260803 A1 | | 11/2005 | Halik et al. |
| 2006/0033086 A1 | | 2/2006 | Gerlach |
| 2006/0197092 A1 | * | 9/2006 | Hoffman et al. ............. 257/72 |
| 2007/0272948 A1 | * | 11/2007 | Koo et al. ................... 257/206 |
| 2008/0135947 A1 | * | 6/2008 | Koo et al. ................... 257/392 |
| 2008/0246095 A1 | * | 10/2008 | Wu et al. ..................... 257/401 |

FOREIGN PATENT DOCUMENTS

| | | |
|---|---|---|
| JP | 06-151307 | 5/1994 |
| JP | 2003-273228 | 9/2003 |
| JP | 2005-079549 | 3/2005 |
| JP | 2005-166713 | 6/2005 |
| JP | 2006-013108 | 1/2006 |
| KR | 19990073642 | 10/1999 |
| KR | 1020020001169 | 1/2002 |
| KR | 1020020096743 A | 12/2002 |
| KR | 1020040063325 A | 7/2004 |
| KR | 1020060070350 | 6/2006 |

OTHER PUBLICATIONS

Annie Wang, et al; "Tunable threshold voltage and flatband voltage in pentacene field effect transistors", Applied Physics Letters 89, pp. 112109-1-112109-3, Sep. 12, 2006.

Hagen Klauk, et al; "Fast Organic Thin-Film Transistor Circuits", IEEE Electron Device Letters, vol. 20, No. 6, pp. 289-291, Jun. 1999 (exact date not available).

Hagen Klauk, et al; "Flexible Organic Complementary Circuits", IEEE Transactions on Electron Devices, vol. 52, No. 4, pp. 618-622, Apr. 2005, (exact date not available).

Shingo Iba, et al; "Control of threshold voltage of organic field-effect transistors with double-gate structures", Applied Physics Letters 87, Jul. 8, 2005, pp. 023509-1-023509-3.

USPTO Office Action mailed Feb. 4, 2009 for Co-Pending U.S. Appl. No. 11/693,830.

USPTO Office Action mailed Jun. 9, 2009 for Co-Pending U.S. Appl. No. 11/693,830.

USPTO Office Action mailed Feb. 3, 2009 for Co-Pending U.S. Appl. No. 11/931,461.

USPTO Office Action mailed Mar. 30, 2009 for Co-Pending U.S. Appl. No. 11/931,461.

USPTO Office Action mailed Sep. 29, 2009 for Co-Pending U.S. Appl. No. 11/931,461.

* cited by examiner

INVERTER

CROSS-REFERENCE TO RELATED APPLICATION

This application claims priority to and the benefit of Korean Patent Application No. 2006-96247, filed Sep. 29, 2006, the disclosure of which is incorporated herein by reference in its entirety.

BACKGROUND

1. Field of the Present Invention

The present invention relates to an inverter comprising a single type transistor, and more particularly, to an organic semiconductor inverter which can be manufactured using an organic semiconductor transistor on a plastic substrate.

2. Discussion of Related Art

Organic field effect transistors have attracted attention as a next generation device because they can be manufactured through a simple process compared to that for the conventional silicon transistors and manufactured on a plastic substrate which is flexible due to its low processing temperature. The organic field effect transistors are mainly used as a switching element of a flexible display or in a circuit such as an RF-ID circuit. When the organic field effect transistor is used as a pixel driving switch of a display, a single polar transistor (for example, a p-type transistor) may just be appropriate, but when it is used as a circuit device, a CMOS transistor which is a combination of p-type and n-type transistors may be mostly appropriate in aspects of power consumption and operating speed.

However, since organic semiconductors have not had stable characteristics and reliability with respect to an n-type device so far, inverters are generally formed to have p-type single characteristics. FIG. 3 illustrates two kinds of inverter structures which can be manufactured using only p-type devices. FIG. 3A illustrates an inverter (D-inverter) in which a load is formed of a depletion transistor and a driver is formed of an enhancement transistor. And, FIG. 3B illustrates an inverter (E-inverter) in which both a load and a driver are formed of enhancement transistors.

The D-inverter type of FIG. 3A may be more preferable than the E-inverter type in aspects of power consumption, gain and swing width, however, since an organic semiconductor cannot control a threshold voltage by doping, unlike a conventional silicon semiconductor, it is difficult to form devices which have different threshold voltage characteristics by locations on the same substrate.

Accordingly, to embody the devices having different threshold voltage characteristics by locations in the structure of FIG. 3A, complicated operations, for example, differently treating the surfaces of devices by locations, have to be conducted. Moreover, the organic semiconductors have a shortcoming in an aspect of uniformity on the same substrate, and thus there is a difficulty in manufacturing a stable inverter.

Moreover, a depletion load makes width/length (W/L) of a transistor large, and an enhancement driver makes the W/L thereof small, and thereby current may be controlled by transistor size effect. Furthermore, passivation of an organic semiconductor still remains as a problem that has to be solved for commercialization.

SUMMARY OF THE PRESENT INVENTION

The present invention is directed to a D-inverter structure having a simple process and improved characteristics.

In particular, the present invention is directed to a stable D-inverter structure comprising an organic semiconductor transistor.

The present invention is also directed to a D-inverter structure comprising an organic semiconductor transistor having excellent depletion characteristics.

The present invention is drastically improving a conventional method of manufacturing an inverter comprising a depletion load and an enhancement driver using transistor width/length (W/L). According to the conventional method, the inverter can be designed and manufacture after all transistor characteristics by W/Ls are obtained to optimally ensure conditions because a transistor having large W/L is used as the depletion load since large current flows on a gate voltage condition of $V_G=0V$, and a transistor having small W/L is used as the enhancement driver, and there is a limit to a degree of integration because the depletion load is generally designed large. Thus, the present invention proposes new structure and manufacturing method of an inverter using a p-type organic semiconductor transistor.

One aspect of the present invention provides an inverter comprising a driver transistor having a bottom gate transistor structure and a load transistor having a top gate transistor structure.

Another aspect of the present invention provides an inverter comprising: a gate electrode of a driver transistor formed on a substrate; a first insulating layer covering the gate electrode of the driver transistor; a source electrode of a driver transistor, a single electrode forming a drain electrode of the driver transistor and a source electrode of a load transistor, and a drain electrode of the load transistor, all of them being formed on the first insulating layer; an organic semiconductor layer formed on the first insulating layer exposed between the source and drain electrodes; a second insulating layer covering the source and drain electrodes and the organic semiconductor layer; and a top gate electrode of the load transistor formed on the second insulating layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the present invention are shown. The present invention may be embodied in various forms and not be limited to the exemplary embodiments described herein.

Figure 1:
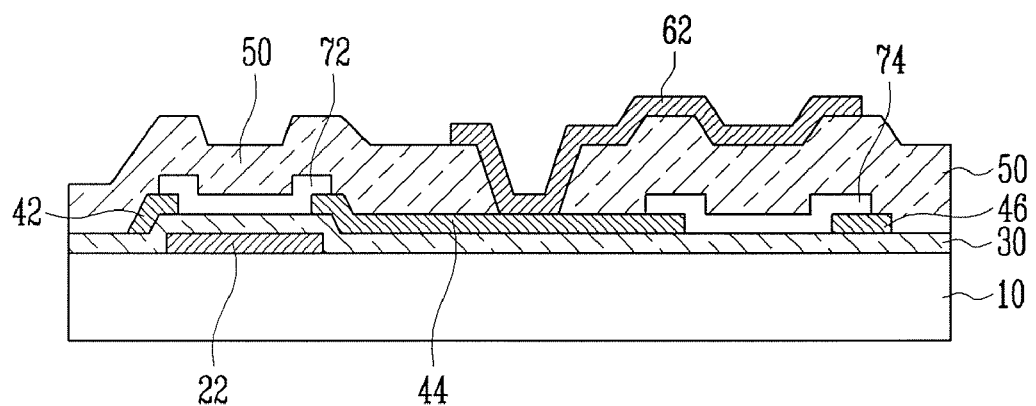
FIG. 1 is a cross-sectional view illustrating a structure of an inverter according to an exemplary embodiment of the present invention.
Figure 2:
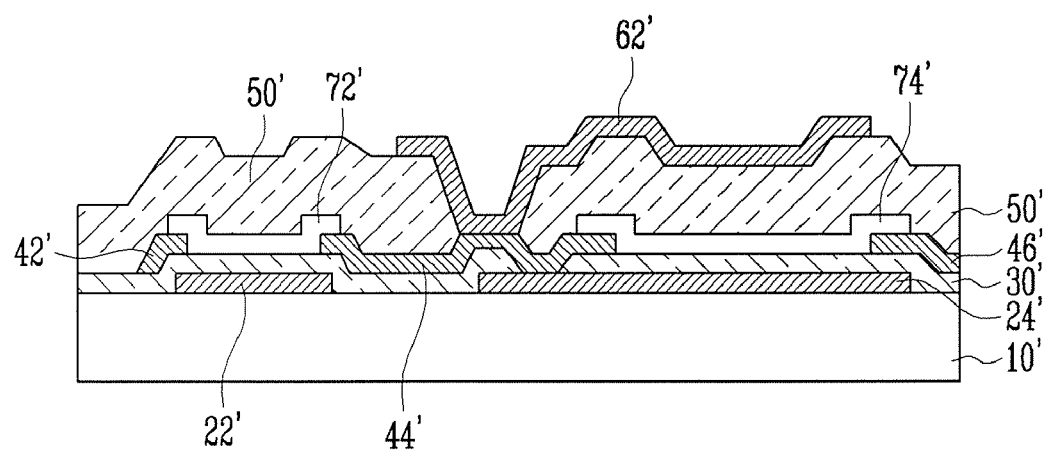
FIG. 2 is a cross-sectional view illustrating a structure of an inverter according to another exemplary embodiment of the present invention.

FIGS. 1 and 2 illustrate structures of new inverters proposed by the present invention.

The inverter illustrated in FIG. 1 comprises: a driver transistor gate electrode 22 formed on a plastic substrate 10; a first insulating layer 30 covering the driver transistor gate electrode 22; a driver transistor source electrode 42, a single layer 44 forming a driver transistor drain electrode and a load transistor source electrode and a load transistor drain electrode 46 which are formed on the first insulating layer 30; two organic semiconductor layers 72 and 74 formed on the first insulating layer 30 which is exposed between the source and drain electrodes; a second insulating layer 50 covering the source and drain electrodes and the organic semiconductor layers 72 and 74; and a load transistor top gate electrode 62 formed on the second insulating layer 50.

The driver transistor formed on the left side of FIG. 1 has a bottom gate organic semiconductor transistor structure in which the gate electrode 22, the first insulating layer 30, and the source and drain electrodes 42 and 44 are sequentially formed, and then the organic semiconductor layer 72 is deposited.

Meanwhile, the load transistor formed on the right side of FIG. 1 has a top gate organic semiconductor transistor structure in which the source and drain electrodes 44 and 46, the organic semiconductor layer 74, a second insulating layer 50 and the top gate electrode 62 are sequentially stacked. That is, the driver transistor is embodied in a bottom gate structure, and the load transistor is embodied in a top gate structure.

Figure 3A:
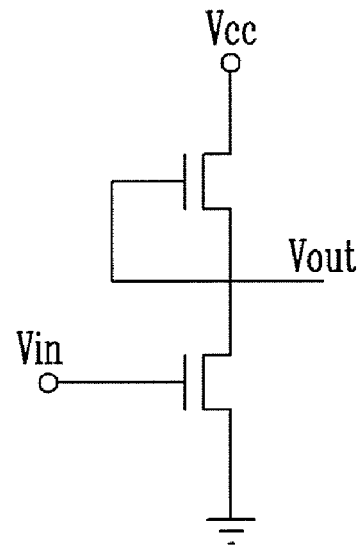
FIG. 3A is a circuit diagram of a D-inverter.
Figure 3B:
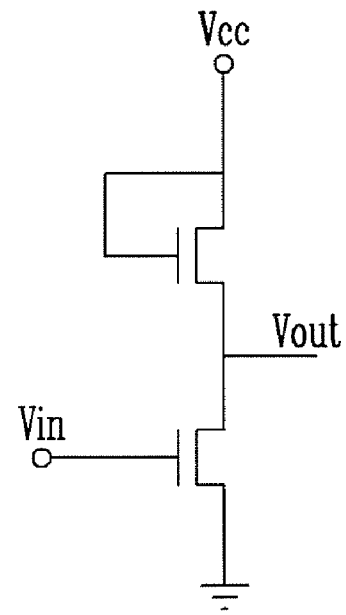
FIG. 3B is a circuit diagram of an E-inverter.

The inverter of FIG. 1 has a D-inverter structure like FIG. 3A, and thus, in the driver transistor, a source is connected to a ground voltage, an input signal $V_{in}$ is applied to a gate, and a drain is connected to a source of the load transistor. Also, in the load transistor, a gate and a source are connected to each other, and a power supply voltage $V_{cc}$ is connected to a drain.

Here, the drain electrode of the driver transistor in the illustrated structure is formed of the same layer 44 as the source electrode of the load transistor, and the gate electrode 62 of the load transistor is electrically and directly connected to the drain electrode of the driver transistor according to a manufacturing process. Thus, a separate connection process for constituting a D-inverter is not necessary. To this end, a proper contact hole may be formed to be electrically connected to the single layer 44 which is the source electrode of the load transistor and the drain electrode of the driver transistor during deposition of the top gate electrode 62 of the load transistor when the second insulating layer 50 is patterned.

The structure in which the drain electrode of the driver transistor and the source electrode of the load transistor are formed of the same layer 44 may easily set width/length (W/L) of the driver and load transistors equal to each other.

Expanding the idea described above, it is possible to make a double gate structure having more excellent characteristics as illustrated in FIG. 2.

A stack structure of the inverter illustrated in FIG. 2 is similar to that of FIG. 1, however there are differences, such as further including a load transistor bottom gate electrode 24' formed of the same layer as a driver transistor gate electrode 22' and forming a contact hole in a first insulating layer 30' to electrically connect a single layer 44' which will be a source electrode of the load transistor and a drain electrode of the drive transistor with the load transistor bottom gate electrode 24'.

The driver transistor of FIG. 2 is the same as the driver transistor of FIG. 1, however, the load transistor may has an on-current characteristic which is almost twice higher in condition of the same W/L using a double gate structure, and thus may have a more excellent depletion characteristic.

The gate electrode 22' of the driver transistor is formed together with the bottom gate electrode 24' of the load transistor, and the bottom gate electrode 24' is covered by the first insulating layer 30'. Then, the first insulating layer 30' is patterned to make a transistor having a desired configuration. Here, a proper contact hole is formed to electrically connect the single layer 44' which will be the source electrode of the load transistor and the drain electrode of the driver transistor with the bottom gate electrode 24' during deposition. The process of forming the contact hole for a top gate electrode 62' of the load transistor is the same as that of FIG. 1.

As such, when the top gate electrode 62' is electrically and directly connected to the bottom gate electrode 24', the load transistor requiring the depletion characteristic may simultaneously turn on or off a bottom gate organic semiconductor transistor and a top gate organic semiconductor transistor, and thus has twice more excellent depletion characteristics.

In order to form the structure described above, processes of forming a second insulating layer 50' and the bottom gate electrode 62' are further added to a conventional organic semiconductor process. However, these layers also function as passivation layers that have to be formed as an upper thin film in a stack structure of an organic semiconductor, and thus it can be noted that there is almost no additional process load caused by these layers.

According to details newly proposed by the present invention in an aspect of materials for manufacturing the structures of FIGS. 1 and 2, the top gate electrodes 62 and 62' of the load transistor may be formed of at least one of titanium (Ti), copper (Cu), chromium (Cr), aluminum (Al), aurum (Au), molybdenum (Mo) and tungsten (W), a conductive oxide layer such as indium tin oxide (ITO) or indium zinc oxide (IZO), or a conductive polymer layer such as poly(3,4-ethylenedioxythiophene) (PEDOT), and the bottom gate electrode 24' of FIG. 2 may also be formed of the same material as the above.

And, the source and drain electrodes 42, 44, 46, 42', 44' and 46' of the driver and load transistors may be formed of at least one of Au, platinum (Pt), nickel (Ni) and palladium (Pd), a conductive oxide layer such as ITO or IZO, or a conductive polymer layer such as PEDOT.

Also, in the case of FIG. 2, a hydrophobic surface treatment process may be applied to the first insulating layer 30' forming a bottom gate upper channel of the driver transistor using octadecyltrichlorosilane (OTS) or hexamethyldisilazane (HMDS) to manufacture an enhancement driver transistor and improve operating characteristics. And, the surface treatment is not profitable for the second insulating layer 50' forming a top gate lower channel of the load transistor, so the surface of the second insulating layer 50' may not be treated to manufacture the depletion load transistor and reduce production cost.

Figure 4:
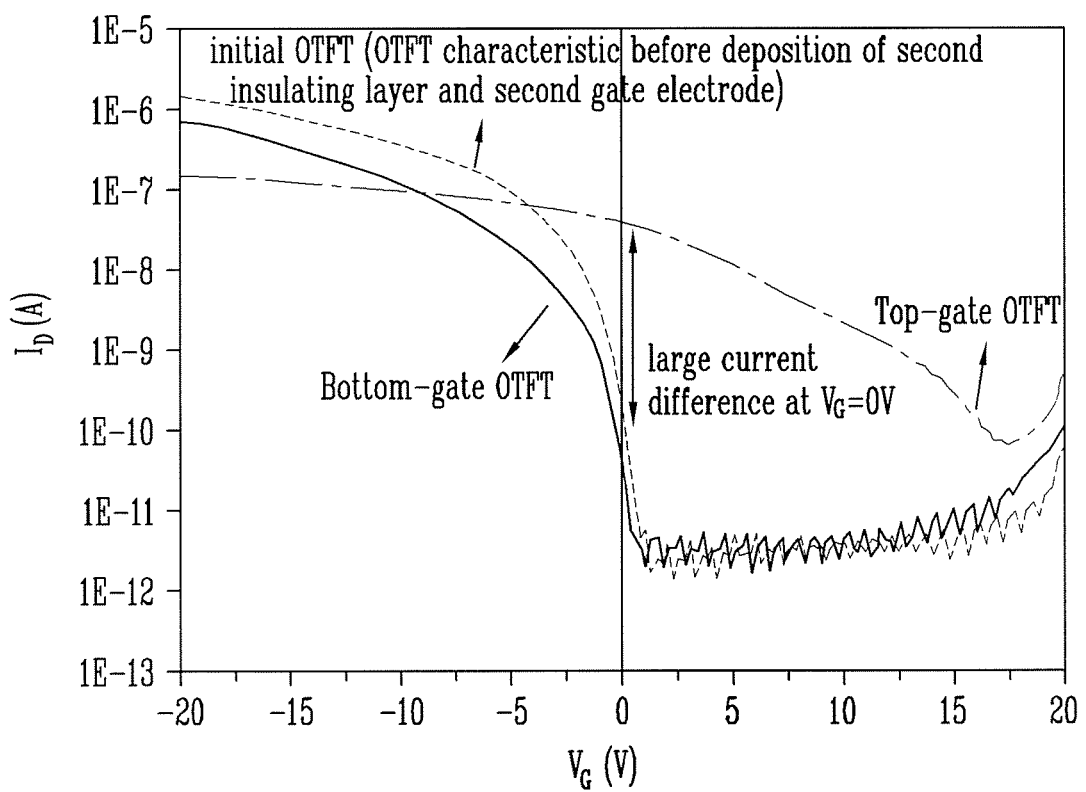
FIG. 4 is a graph illustrating improvement of organic thin film transistor (OTFT) characteristics of an inverter according to the present invention.

FIG. 4 illustrates a transfer curve of bottom gate and top gate organic semiconductor transistors in which a first insulating layer is formed of $Al_2O_3$ and a second insulating layer is formed of low temperature $Al_2O_3$ deposited at a temperature of 100° C. or less. Here, the bottom gate organic semiconductor shows enhancement type characteristics, and the top gate organic semiconductor shows depletion type characteristics. When the two kinds of transistors are connected in the form of a D-inverter, a large current difference is generated at $V_G=0V$ as illustrated in FIG. 4.

As described above, a structure of a D-inverter which has a simple manufacturing process, in particular, a stable structure of a D-inverter composed of an organic semiconductor transistor may be provided.

Also, the D-inverter composed of the organic semiconductor transistor has an excellent turn-on current characteristic, that is, an excellent depletion characteristic.

The D-inverter in which a depletion type transistor and an enhancement type transistor are connected to each other may be more easily embodied compared to a method using a conventional transistor size effect.

When a double gate structure is applied, the D-inverter may be embodied even with the same W/L, and thus a degree of integration may be improved, and both a second insulating layer and a top gate electrode function as a passivation layer, and thus life span and stability of the inverter device may increase.

While the present invention has been shown and described with reference to certain exemplary embodiments thereof, it will be understood by those skilled in the art that various changes in form and details may be made therein without departing from the spirit and scope of the present invention as defined by the appended claims.

What is claimed is:

1. An inverter, comprising:
    a driver transistor having a bottom gate transistor structure; and
    a load transistor having a top gate transistor structure,
    wherein the inverter has a structure of a D-inverter,
    wherein a single electrode forms both a drain electrode of the driver transistor and a source electrode of the load transistor and the single electrode is electrically and directly connected to a gate electrode of the load transistor, and
    wherein channels of the driver transistor and the load transistor are only formed by one type, either n-type or p-type.

2. The inverter according to claim 1, wherein a drain electrode of the driver transistor and a source electrode of the load transistor are formed of the same layer.

3. The inverter according to claim 1, wherein the driver transistor and the load transistor are organic semiconductor transistors.

4. The inverter according to claim 1, wherein, in the driver transistor, a source is connected to a ground voltage, an input signal is applied to a gate, and a drain is connected to a source of the load transistor, and in the load transistor, a gate and the source are connected to each other and a drain is connected to a power supply voltage.

5. The inverter according to claim 1, wherein the driver transistor and the load transistor have the same width/length (W/L).

6. The inverter according to claim 1, wherein the load transistor has a double gate structure of a bottom gate and a top gate.

7. The inverter according to claim 6, wherein a drain electrode of the driver transistor is electrically and directly connected to a bottom gate electrode of the load transistor, and the drain electrode of the driver transistor is electrically and directly connected to a top gate electrode of the load transistor.

8. The inverter according to claim 7, wherein the drain electrode of the driver transistor and the source electrode of the load transistor are formed of the same layer.

9. The inverter according to claim 6, wherein a drain electrode of the driver transistor and the bottom and top gate electrodes of the load transistor are electrically connected through a contact hole.

10. The inverter according to claim 1, wherein a top gate electrode of the load transistor is formed of at least one of titanium (Ti), copper (Cu), chromium (Cr), aluminum (Al), aurum (Au), molybdenum (Mo) and tungsten (W), indium tin oxide (ITO), indium zinc oxide (IZO), or poly(3,4-ethylenedioxythiophene) (PEDOT).

11. The inverter according to claim 1, wherein source and drain electrodes of the driver transistor and the load transistor are formed of at least one of Au, platinum (Pt), nickel (Ni) and palladium (Pd), ITO, IZO, or PEDOT.

12. The inverter according to claim 1, wherein a hydrophobic surface treatment process is applied to a first insulating layer forming a bottom gate upper channel of the driver transistor using octadecyltrichiorosilane (OTS), hexamethyldisllazane (HMDS), etc., and the surface treatment is not applied to a second insulating layer forming a top gate lower channel of the load transistor.

13. An inverter, comprising:
    a gate electrode of a driver transistor formed on a substrate;
    a first insulating layer covering the gate electrode of the driver transistor;
    a source electrode of a driver transistor, a single electrode forming both a drain electrode of the driver transistor and a source electrode of a load transistor, and a drain electrode of the load transistor, all of them are formed on the first insulating layer;
    an organic semiconductor layer formed on the first insulating layer exposed between the source and drain electrodes;
    a second insulating layer covering the source and drain electrodes and the organic semiconductor layer; and
    a top gate electrode of the load transistor formed on the second insulating layer, and electrically and directly connected to the single electrode.

14. The inverter according to claim 13, wherein, in the second insulating layer, a contact hole for electrically connecting the top gate electrode of the load transistor and the single electrode is formed.

15. The inverter according to claim 13, further comprising a bottom gate electrode of the load transistor formed of the same layer as the gate electrode of the driver transistor.

16. The inverter according to claim 15, wherein, in the first insulating layer, a contact hole for electrically and directly connecting the bottom gate electrode of the load transistor and the single electrode is formed.

17. The inverter according to claim 13, wherein the substrate is a plastic substrate.

* * * * *